United States Patent [19]
Lohmann

[11] 3,949,310
[45] Apr. 6, 1976

[54] COUNTING ELEMENT FOR THE STRUCTURE OF SYNCHRONOUS MODULO-N OR $2^m$ COUNTERS

[75] Inventor: Heinz-Juergen Lohmann, Braunschweig, Germany

[73] Assignee: Siemens Aktiengesellschaft, Berlin & Munich, Germany

[22] Filed: Jan. 24, 1975

[21] Appl. No.: 543,665

[30] Foreign Application Priority Data
Mar. 18, 1974 Germany............................ 2412906

[52] U.S. Cl............ 328/41; 307/220 R; 307/222 R; 328/44
[51] Int. Cl.$^2$.................. H03K 21/00; H03K 23/06
[58] Field of Search ............................ 307/220–225; 328/41–45; 235/92 DM, 92 GD, 92 EV, 92 BN

[56] References Cited
UNITED STATES PATENTS

| | | | |
|---|---|---|---|
| 3,277,380 | 10/1966 | Paufve................... | 328/42 |
| 3,349,332 | 10/1967 | Bleickardt............... | 328/42 |
| 3,544,773 | 12/1970 | Peddie.................... | 235/92 |
| 3,548,319 | 12/1970 | Price...................... | 328/42 |
| 3,576,973 | 5/1971 | Draper.................... | 328/42 |
| 3,601,704 | 8/1971 | Seltzer.................... | 328/41 |

*Primary Examiner*—Stanley D. Miller, Jr.
*Attorney, Agent, or Firm*—Hill, Gross, Simpson, Van Santen, Steadman, Chiara & Simpson

[57] ABSTRACT

A counting element for constructing synchronous modulo-n or modulo-$2^m$ counters having a storage member which comprises a master-slave flip-flop. A majority decision circuit is connected to the master-slave flip-flop to provide a majority decision indication concerning two variables and an output of the slave, the slave being directly connected at one input thereof with the master and indirectly by way of an inverter at its other input so that the storage member fulfills the truth table

| S | R | Qto | Qtl |
|---|---|-----|-----|
| L | O | O | O |
| L | L | O | L |
| O | L | L | L |
| O | O | L | O |
| L | O | L | L |
| L | L | L | L |
| O | L | O | O |
| O | O | O | O | which satisfies the Boolean equation

Qt1 = S · R + Qto · (S + R).

A plurality of counter elements are connected in a serial chain, and connected with additional majority decision circuits, and other components such as additional storage circuits and EXCLUSIVE OR gates, to constitute either modulo-n or modulo-$2^m$ counters.

4 Claims, 8 Drawing Figures

COUNTING ELEMENT FOR THE STRUCTURE OF SYNCHRONOUS MODULO-N OR 2M COUNTERS

BACKGROUND OF THE INVENTION

1. Field of the Invention

This invention relates to a counter element for constructing synchronous modulo-n or $2^m$ counters having a storage member, which is constructed of a master-slave flip-flop wherein a circuit for performing a majority decision of two variables in conjunction with the output of the slave is connected directly to one input of the master and indirectly to the other input by way of an inverter so that the storage member operates in accordance with the truth table

| S | R | Qto | Qtl |
|---|---|-----|-----|
| L | O | O | O |
| L | L | O | L |
| O | L | L | L |
| O | O | L | O |
| L | O | L | L |
| L | L | L | L |
| O | L | O | O |
| O | O | O | O | the truth table corresponding to the Boolean equation $$Qtl = S \cdot R + Qto \cdot (S + R).$$

2. Description of the Prior Art

Synchronous modulo-n counters do not have a decade structure. These counters count in a dual code up to the number n and then resume counting. The number of the counting elements required for a modulo-n counter can be determined from the number raised to the power two so that the expression $2^m \geq n$ applies. In this relationship $m$ constitutes the number of required counting elements. There are not only counter circuits which have a single preferred counting direction in counting techniques, but also counter circuits which, via an additional control input counting operations can be switched from forward to backward counting and vice versa. These counting circuits generally require a considerable amount of additional switching means in addition to the actual counting elements, also called counter flip-flops. Basically, synchronous modulo $2^m$ counters are constructed from a number of counter elements and constitute dual code counters which can count numbers raised to the power of two. These counters can be of particularly simple structure. The two mentioned types of counters are synchronous counters since the counting elements of the same counter switch in response to the same pulse.

SUMMARY OF THE INVENTION

This invention is based on the object of providing a special counter element for the contruction of counters of the initially-mentioned type, as well as to the design of counters utilizing this counting element, whereby each counting element should comprise an electronic storage member which is per se heretofore known in digital data processing arrangements having a higher error safety point, as is described, for example, in British Letters Patent 1,357,862. This known storage member, as well as a circuit arrangement for the majority decision of three variables will be explained in greater detail below for a better understanding of the invention.

BRIEF DESCRIPTION OF THE DRAWINGS

Other objects, features and advantages of the invention, its organization, construction and operation will be best understood from the following detailed description thereof taken in conjunction with the accompanying drawings, on which.

DESCRIPTION OF THE PREFERRED EMBODIMENTS

Figure 1:
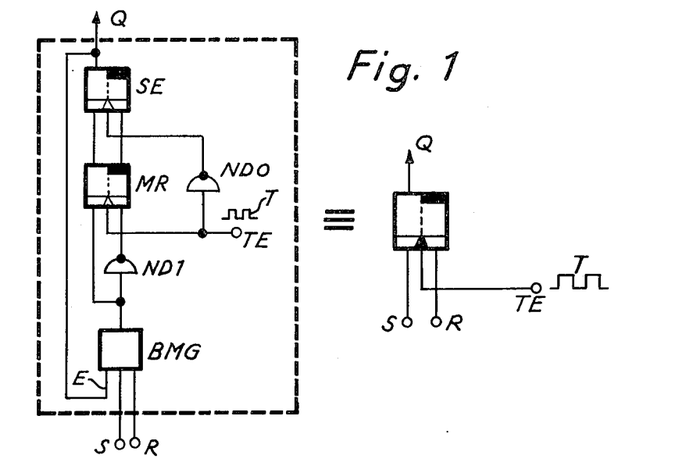
FIG. 1 is a schematic illustration of a master-slave flip-flop having a feedback path by way of a majority decision circuit.

The switching arrangement illustrated in FIG. 1 shows an electronic storage circuit which is well known in the art for switching variables in the form of dynamic signals, whereby the information content of the signals is defined in the phase position of the respective signals with respect to prescribed reference signals. In the left-hand portion of FIG. 1, an individual illustration of elements required for the storage circuit is provided with known logic symbols. In the right-hand portion of FIG. 1, a symbol of the entire storage circuit which is used for the exemplary embodiment of the invention is illustrated, having characteristics which fulfill the initially shown truth table, as well as the aforementioned Boolean equation.

The storage circuit illustrated in the left-hand portion of FIG. 1 basically consists of a RS master-slave flip-flop in which the master is denoted with MR and the slave SE. The pulse signals whcih are necessary for the control of the slave SE or the master MR, respectively, are directed by way of the pulse input TE directly to the master MR and by way of a negation member or inverter NDO to the subsequently connected slave SE. The signal input to the RS master-slave flip-flop does not, as is the usual case, take place directly by way of the master MR, but by way of a component group BMG, having three inputs E, S and R and connected in front of the master MR.

The group of components BMG has the task of carrying out a majority decision of the switching variables provided at the three inputs E, S and R in the form of prescribed signal voltages in connection with an inversion of the output signal. A circuit for this purpose is illustrated, for example, in the left-hand portion of FIG. 4. The output signals of the component group BMG are fed directly to the set input of the master MR and directly to the reset input of the master MR by way of a negation member or inverter ND1.

When using a component group for the majority decision without an output signal inversion, the two input terminals at the master MR only have to be exchanged, one with the other, as compared to the present illustration.

The output Q of the storage circuit illustrated in FIG. 1 is connected, by way of a feedback branch, with one input E of the component group BMG. The other two inputs S and R of the component group BMG are provided for receiving switching variables, the switching variables having respective logical values during the use of the storage circuit which is provided in positive or negative logic either by the phase position of the rectangular signal voltages as compared to prescribed rectangular reference voltages, or by the respective amplitude of the signal voltages employed. In the first case, the rectangular signal voltages which are used as switching variables have a phase difference of 180° if their logical values differ. When using the storage circuit according to FIG. 1 for static signals, an additional inversion must be provided in the feedback branch between the slave SE and the input E of the component group BMG. This can, for example, be carried out in that the input E of the component group BMG is connected with the other output of the slave SE which, in the present example, is not connected to any other point in the circuit.

The storage circuit which is briefly described above and which is to be used in the counter element according to the invention for the structure of synchronous modulo-n or $2^m$ counters is illustrated for reasons of simplification in the manner of illustration in the following exemplary embodiments as a simple, pulse control flip-flop with two inputs S and R, as well as with an output Q and a pulse input which is not further denoted, but understood to be that of the right-hand part of FIG. 1.

Figure 2:
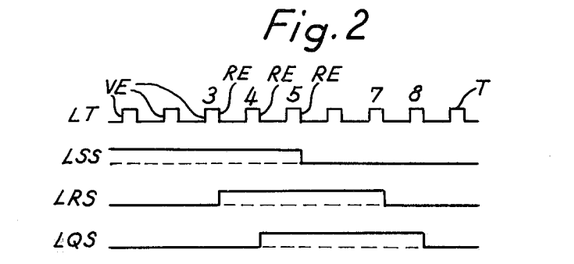
FIG. 2 is a diagram of switching voltages, with respect to time, which are dependent on the logical value of the assigned switching voltages, which value is determined by the respective amplitude of the signal voltages.
Figure 3:
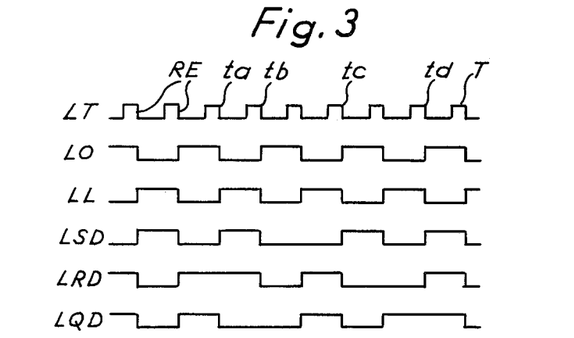
FIG. 3 is a diagram of rectangular signal voltages for illustrating switching variables, which variables have logical values which are defined by the respective phase positions of the signal voltages with respect to prescribed comparison signals.

FIGS. 2 and 3 each illustrate in the upper portion thereof a diagram line LT which is the course of the pulse signals T for the pulse input of the storage circuit according to FIG. 1. In response to the leading edge VE of the pulses T, the master MR is adjusted corresponding to the signal configuration located at its set or reset input, respectively, or is reset to the illustrated basic position. This is implemented in the case of the master MR, as well as in the case of the slave SE, by means of wiring techniques which are not illustrated or described in greater detail but are well known in the art as a basic operation during activation of such circuits. When setting or resetting the master MR, the slave SE remains blocked. The signals released by the master MR are transferred in each case during the following trailing edge RE of the respective pulse T by the slave SE. During this time the master MR is blocked.

The use of randomly different signal voltages for the switching variables has already been pointed out heretofore in the specification. In the digital data processing for the illustration of the logic value 0 or L, the switching variable is generally separated into high and low signal levels of signal voltages. In the widely known TTL technique, in positive logic a determination has taken place to the effect that a switching variable with a value 0 is represented by a signal voltage of approximately zero volt. The logic value L, however, amounts to approximately 3.5 volt.

The time-wise courses of signal voltages in the diagram lines LSS, LRS and LQS in FIG. 2 also apply to the positive logic, so that the input S of the storage circuit according to FIG. 1 receives, as viewed with respect to time up to the trailing edge RE of the pulse 5, with a high signal level, the switching variable of the value L.

It should be pointed out once more that the arrangement according to the left-hand portion of FIG. 1, in the chosen illustration, is only for dynamic signals according to FIG. 3; when using static signals according to FIG. 2, a negation, which is not illustrated, must be provided in the feedback line between the slave SE and the input E of the component group BMG.

According to the diagram line LRS, the reset input R of the storage circuit according to FIG. 1 receives, following the trailing edge of the pulse 3, up to the trailing edge of the pulse 7, the switching variable of the value L with a high signal level. In the case of a low signal level, the ratios for the set input S and the reset input R of the storage circuit according to FIG. 1 on the left-hand side reverse. The course of the signal at the output Q is illustrated in the diagram line LQS. This signal extends from the trailing edge RE of the pulse signal 4 up to the trailing edge RE of the pulse signal 8 (compare diagram line LT) high signal levels which correspond to the switching variables of the value L. This result of storage can easily be determined by applying the Boolean equation $Qtl = S \cdot R + R \cdot Qto \cdot (S + R)$ while considering the logical value of the variable at the inputs S and R, as well as the respective "old" logical condition Qto at the output Q. The Boolean equation applies to the storage circuit in the case of static signals, as well as dynamic signals, for the illustration of the required switching variables.

The diagram lines LO, LL, LSD, LRD and LQD of FIG. 3 illustrate rectangular signal voltages with a prescribed repetition frequency. The signals in the lower three diagram lines LSD, LRD and LQD represent, in comparable times, the same logic value of switching variables as the signals LSS, LRS and LQS according to FIG. 2. However, there is a significant difference between the courses of the signals of FIGS. 2 and 3 in that the respective value of the switching variable on the one hand is provided by signals which are static and on the other hand by signals which are dynamic. The respective value results either from the amplitude, on the other side by the phase position. The rectangular signal voltages which are illustrated in the diagram lines LO and LL of FIG. 3 are basically shifted in respect of each other in phase position by 180° and constitute the two possible logic values 0 and L of switching variables, as well as serving as comparable magnitudes. The second diagram line LO of FIG. 3 illustrates, consequently the course and in particular the phase position of signal voltages which exist on one or several of the inputs S and R, respectively, and the output Q of the storage circuit according to FIG. 1 at the value 0 of the switching variables. The diagram line LL illustrates the course of signal voltages which illustrate by their phase position the logic value L of the switching variables at the inputs S and R or at the output Q, respectively, of the storage circuit according to FIG. 1.

In order to promote the understanding and the practice of the invention with preferred dynamic signals according to FIG. 3, in connection with the example of a storage circuit according to FIG. 1, it is at first presumed that the set input S of the storage circuit is fed a switching variable such as is illustrated in the diagram line LSD. Correspondingly, the switching variable of the diagram line LRD is assigned to the reset input R. The course of the signals for each of these two signals, or the switching variables, respectively at the output Q of the storage circuit according to FIG. 1 can be recognized in the diagram line LQD.

In order to make possible a comparison of the signal configurations provided in the diagram lines according to FIG. 3 with the truth table which is valid for the storage circuit, the truth table is provided again at this point.

| S | R | Qto | Qtl |
|---|---|-----|-----|
| L | O | O   | O   |
| L | L | O   | L   |
| O | L | L   | L   |
| O | O | L   | O   |
| L | O | L   | L   |
| L | L | L   | L   |
| O | L | O   | O   |
| O | O | O   | O   |

A comparison of the diagram lines LSD, LRD and LQD with the diagram lines LO and LL, in conjunction with the pulse signals T in the diagram line LT, shows that the input variables have the value L at the set input S of the storage circuit up to the time ta, and the value 0 at the reset input R; whereas, the value of the signal at the output Q of the storage circuit according to FIG. 1 is also 0. In the truth table Qto refers to the "old" signal condition at the output Q of the storage circuit, prior to the transfer of signal configuration by the slave SE which exists at the inputs S and R of the component group BMG. Upon the occurrence of the trailing edge RE of the following pulse signal T, a value of the output signal occurs at the output Q of the storage circuit, which in the truth table is generally referred to as Qtl.

As can be recognized from the diagram line LRD, after the time ta the switching variable existing at the reset input R of the storage circuit changes its value from the logic 0 to the logic L, since the signal illustrated in the diagram line LRD is now in phase with the signal illustrated in the diagram line LL as a comparison signal. The values of the signal configuration presumed in the present operating example at the inputs S and R, as well as at the output Q, of the storage circuit can be learned from the second line of the truth table denoted with L, L as well as 0 for Qto. After the time tb, the storage circuit releases following the majority decision and transfer by the slave SE at the output Q a rectangular signal with the value L. In order to recognize the same the diagram lines LQD and LL must be compared after the time tb. It can be observed that the courses of the mentioned signals coincide in phase position from the time tb.

After the pulse signal which is located between the period tb and tc the value of one of the switching variables, and therefore the corresponding signal, has changed at the input S of the storage circuit from the logic L to the logic 0; compare diagram line LSD as well as the third line of the truth table. At the time tc, as a result of the input variable change, now as before the value L is located at the output Q, as can be learned from the diagram line LQD in connection with the comparison signal in the diagram line LL. The value stated in the fourth line of the truth table, namely 0, 0 for the input variables at the inputs S and R of the storage circuit according to FIG. 1 and the value L existing at the output Q are available after the trailing edge of the pulse T located between the periods tc and td, after, in addition, the value of the input signal has changed at the reset input R of the storage circuit (compare the diagram line LRD). In dependency on this given signal configuration, the slave SE releases after the acceptance at the time td, via the output Q, a signal corresponding to the switching variable with the value 0.

Figure 4:
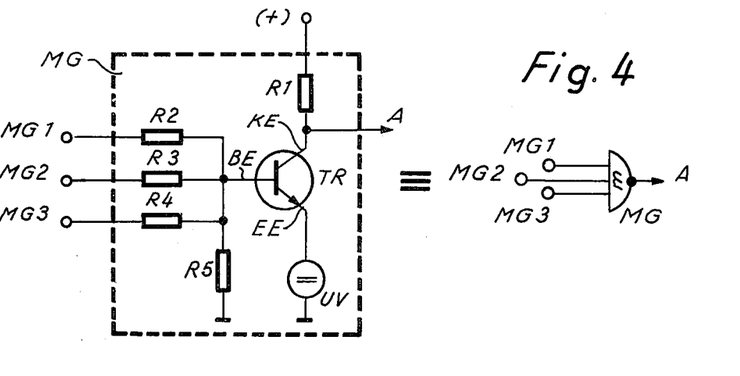
FIG. 4 is a schematic circuit diagram for a majority decision circuit for providing a majority decision with respect to three variables, and a circuit symbol for the majority decision circuit.

FIG. 4 illustrates in a left-hand portion thereof a preferred exemplary embodiment of the circuit for a majority decision of three variables with an output signal inversion, briefly called a majority decision circuit, which is shown with discrete components in the left-hand portion of FIG. 4 and symbolically in the right-hand portion of FIG. 4. Basically, the circuit MG comprises a transistor TR. The transistor TR having a collector electrode KE which is connected via a load resistor R1 to a positive potential. The transistor TR further comprises a base electrode BE which is connected to a resistance network comprising three additional resistors R2, R3 and R4 which are respectively connected with three inputs MG1, MG2 and MG3. Furthermore, the base electrode BE is connected by way of a further resistor R5 to ground potential. The transistor TR further comprises an emitter electrode EE which is connected to a positive potential provided by a voltage source UV. The transistor TR is therefore definitely blocked when there is no signal at the inputs MG1--MG3. The transistor TR only switches through if two of the inputs MG1--MG3 receive electrical signals in accordance with the switching variable L in such a way that the voltage decreased at the resistor R5 is larger than the voltage of the voltage source UV increased by the threshold voltage between the base and emitter electrodes BE and EE of the transistor TR. The result of a majority decision of the three values of the switching variables connected to the inputs MG1--MG3 is emitted at the output A in an inverted manner. In the truth table according to FIG. 5 for the majority decision circuit, the references of the inputs MG1, MG2 and MG3 as well as the reference A of the output of the circuit MG are illustrated. In this context attention is invited that the three inputs MG1--MG3 of the majority decision circuit are entirely equal, which can easily be seen from the resistance matrix.

Figure 5:
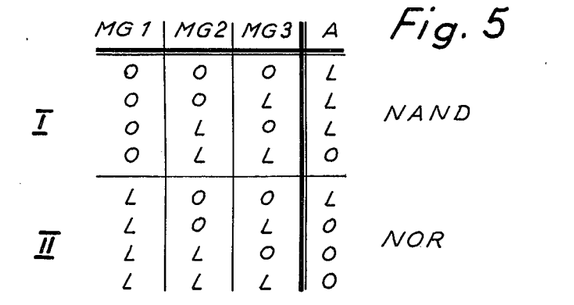
FIG. 5 is a truth table for the switching arrangement according to FIG. 4.

It was presumed in block I of FIG. 5 that in all four variation possibilities of switching variables at the inputs MG2 and MG3, the input MG1 is charged by the switching variable with the value 0. A comparison of the values of switching variables for the inputs MG1--MG3 with the coupling result in the column A reveals that the majority decision circuit MG operates in the presumed case like a NAND gate. If, however, the switching variable with the value L is applied to the input MG1, as in block II in FIG. 5, the switching variables which are directed to the remaining inputs MG2 and MG3 are correspondingly coupled in accordance with a NOR function.

As briefly mentioned above, the invention is based on the task of utilizing circuit arrangements according to FIG. 1 and FIG. 4 to provide a counter element by means of which synchronous modulo-n or $2^m$ counters can be constructed which, when compared to known counters, require very little effort and expenditure.

According to the invention, the required counter element is realized in that at the reset input of the storage circuit a first multiple decision circuit with three inputs and output signal inversion are connected, as well as that a second majority decision circuit without an output signal inversion is connected to the set input, in that one input each of the two majority decision circuits are connected together as a counter information input, in that another input of the first majority decision circuit receives the output signals of the storage circuit directly and in a negated manner an input of the second majority decision circuit receives the output signals of the storage circuit, in that the third inputs of the first and second majority decision circuits each serve as first and second control inputs, and in that as a counter information output a negation circuit is connected to the reset input.

Since, as was explained in detail above with respect to FIGS. 4 and 5, the majority decision circuits can be connected without problems between the NAND and NOR functions, the counter element according to the invention illustrates the special precondition for the concept of counters which can be reversed in the counting direction.

A preferred exemplary embodiment of synchronous modulo-$2^m$ counters with a reversible counting direction and basic input by using the counting element according to the invention is characterized in that a number of m counter elements is connected by way of their counter information outputs and counter information inputs in series, in that the first control inputs of the counter elements form, when connected together, the basic input and are connected with an input of an EXCLUSIVE OR gate, by way of which second input L pulses to be counted are applied and whose output is connected with the counter information input of the first counter element referred to the forward counting direction, and in that the second control inputs of the counter elements form, when connected together, the switching input which is connected by way of an OR gate with the first control inputs.

Also, by using the counter element according to the invention, a preferable construction of synchronous modulo-n counters can be obtained which can be used in a preferred manner as frequency dividers. Such a counter is characterized in that several counter elements are connected in series via their counter information outputs and counter information inputs, in that the counter information output of the last counter element referred to the counting direction is connected with the set and reset input of a storage circuit comprising a master-slave flip-flop having a majority decision circuit whose output is connected on the one hand with the second control inputs of those counter elements, which in case of a transmission signal from the last counter element should be set for a preset condition of the counter, and that at the output of the storage circuit on the other hand the first control inputs of those counter elements are connected which should not be set in the case of the transmission signal, and in that all other first and second control inputs of the counter elements receive a control characteristic having a logic value 0.

Several exemplary embodiments of the invention are illustrated on the drawing as explained in detail below with particular reference to FIGS. 6, 7 and 8.

Figure 6:
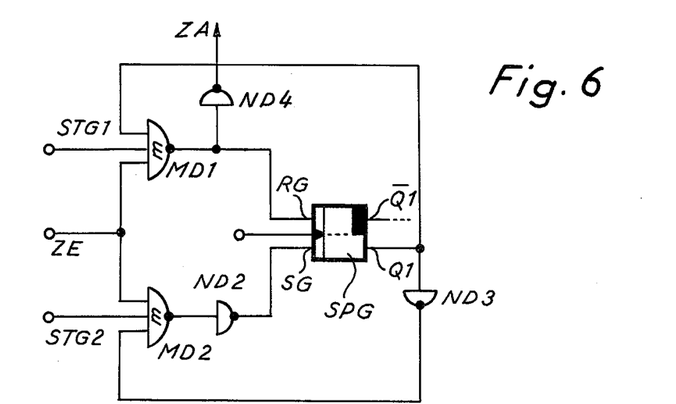
FIG. 6 is a schematic diagram of a counter element including majority decision circuits.

FIG. 6 illustrates the switching arrangement of a counter element having a storage member SPG which fulfills the initially described Boolean equation. A pair of majority decision circuits MD1 and MD2, respectively, each with output signal inversion, is connected to the reset input RG and the set input SG of the storage circuit SPG corresponding to the example illustrated in FIG. 4. An inverter MD2 is connected between the majority decision circuit MD2 and the set input SG to provide an additional inversion of the inverted output signal of the circuit MD2. It is also possible to use instead of the majority decision circuit MD2 used in the present example, another such circuit which releases non-inverted output signals due to its internal structure. In such a case, the inverter MD2 could be eliminated.

The output Q1 which is assigned to the set input SG of the storage circuit SPG is connected by way of an input of the majority decision circuit MD1 with the reset input RG of the storage circuit SPG. Furthermore, an inverter ND3 is connected to the output Q1 and has its output connected to an input of the second majority decision circuit MD2. Each of the majority decision circuits MD1 and MD2 have an input which is commonly connected to the other to form a counter k information input ZE of the counter element. A further inverter ND4, which is connected to the reset input RG and with the output of the first majority decision circuit MD1 serves as a counter information output ZA. The third input of both majority decision circuits MD1 and MD2 is used in the later application of the counter element in counters as a control input STG1 or STG2, respectively.

Nothing changes in the basic character in the counter element which was briefly explained with respect to its structure, if the inverter ND3 is eliminated and the line is connected to the output $\overline{Q1}$. The inverter ND3 can also be eliminated if the counter elements according to FIG. 6 are used in two-channel switching units with antivalent signals. It is determined thereby that the circuit arrangement according to FIG. 6 is located, for example, in the original channel and that the line connected to the inverter ND3 which is to be eliminated is connected to the output of the respective storage circuit in the complementary channel.

In the following, several characteristic features of the counter element will be explained in more detail. If, for example, the switching variable with the value L is provided to the control input STG1 and the switching variable with the logic value 0 is provided to the other control input STG2, then the majority decision circuit MD1 operates as a NOR circuit and the majority decision circuit MD2, in connection with the inverter ND2, operates as an AND gate. This leads to the result that in the case of a set storage circuit SPG, that means in the case of an output signal with the value L, a signal with the value 0 reaches the reset input RG of the storage circuit SPG via the output Q, independently of whether a counter information with the value L or no counter information is available via the counter information input ZE. The majority decision circuit MD2 receives, at the same time, due to the above-mentioned preconditions, a signal with the value of logic 0 via the control input STG2. Then the majority decision circuit MD2 operates in connection with the inverter ND2 as an AND gate. In case of the existing input signal configuration for the majority decision circuit MD2, in particular three times the value of the logic 0, in case of a non-existing counter information at the counter information input ZE, the set input SG of the storage circuit SPG receives a signal with the value 0. Therefore, the set input, as well as the reset input, of the storage circuit SPG has an input variable with the value 0 which, according to the truth table illustrated for the storage circuit, causes the circuit to be reset.

When using the counter element in counters for forward counting, the two control inputs STG1 and STG2 each receive a signal with the value 0. With this configuration, the majority decision circuit MD1 operates as a NAND gate. The second majority decision circuit MD2 acts, in connection with the inverter ND2, as an AND gate. If it is presumed in this operating example that the storage circuit SPG is in the illustrated basic position, whereby a signal with the value L is released via the output $\overline{Q1}$, a counter information with the value L conducted by way of the counter information input ZE has the effect of setting the storage circuit SPG. This changes the output signal conditions. With the next information conducted on the counter information input ZE, the storage circuit SPG is again reset into the basic position. This mode of operation continues with respect to further counter information.

Figure 7:
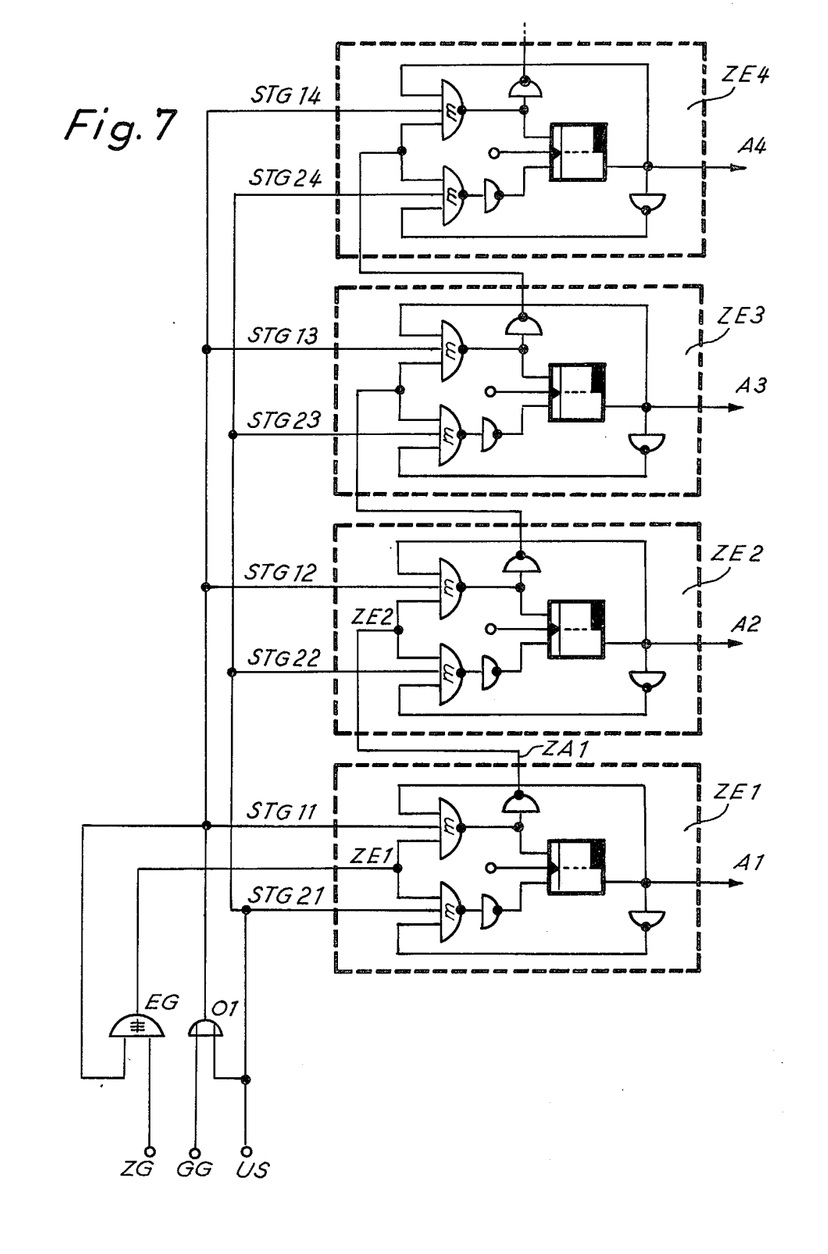
FIG. 7 is a schematic diagram of a modulo-16 counter which is reversible in the counting direction.

A circuit arrangement according to FIG. 7 illustrates a synchronous modulo-$2^m$ counter having reversible counting directions and a basic position input GG by utilizing $m=4$ counter elements ZE1--ZE4 whose outputs are designated A1--A4 for providing the respective counter reading. The first counter element ZE1 in the forward counting direction has its counter information output ZA1 connected to the counter information input ZE2 of the next counter element ZE2 provided in the correct sequence. Corresponding connections also apply to the remaining counter elements. All first control inputs STG11, STG12, STG13 and STG14 of the counter elements ZE1--ZE4 are connected together and are connected with the output of an OR gate 01. The input GG of the OR gate 01 constitutes the basic input of the modulo $2^4$ counter. All second control lines STG21, STG22, STG23 and STG24 of the counter elements ZE1--ZE4, are connected together and form the switching input US. The input US is also connected as the second input of the OR gate 01. The counter information required for advancing the counter, in the form of L pulses, is directed by way of an input ZG of an EXCLUSIVE OR gate EG which has its output connected with the counter information input ZE1. The EXCLUSIVE OR gate EG is of significance in connection with the reverse counting operation, whereby a switching input signal US with the logic value L is received. The other input of the EXCLUSIVE OR gate EG is connected with the first control inputs STG11, STG12, STG13 and STG14 of the counter elements ZE1--ZE4.

since the meaning of the first and second control inputs, for example STG11 and STG21, of the counter element ZE1 has already been described by means of the counter elements illustrated in FIG. 6, it can be readily appreciated that the counter according to FIG. 7 is set upon receipt of a signal having the value L at the input GG in the illustrated basic position.

If there is a signal with the value 0 at the basic position input GG, as well as on the switching input US, the counter operates in the forward counting direction, whereby a counter information from the counter element ZE1 supplied via the EXCLUSIVE OR gate EG is further conducted in the direction of the counter element ZE4, while all four counter elements are controlled synchronously at the transit of a counter element in its basic position to the next higher counter element up to the counter element ZE4.

If the counter according to FIG. 7 is to operate in the reverse counting direction as a backward counter, which means with a bit movement from the counter element ZE4 in the direction toward the counter element ZE1, the transmission of the released counter element has to be created at its transit into the reverse position. This is achieved in that instead of the AND gate and OR gate required for the forward counting direction, and instead of the NAND gate a NOR gate is provided in front of the individual storage members in the counter elements. This is easily made possible according to the foregoing explanations and those explanations particularly in respect of FIG. 6, in that a signal is applied to the switching input Us which has the value L. With this configuration, under consideration of the OR gate O1, all control control inputs STG11, STG21, STG12, STG22, STG13, STG23, STG14 and STG24 receive a signal with the value L. This furthermore also applies to the input of the EXCLUSIVE OR gate EG. With this signal configuration, the counter information which is conducted by way of the input ZG is inverted.

Figure 8:
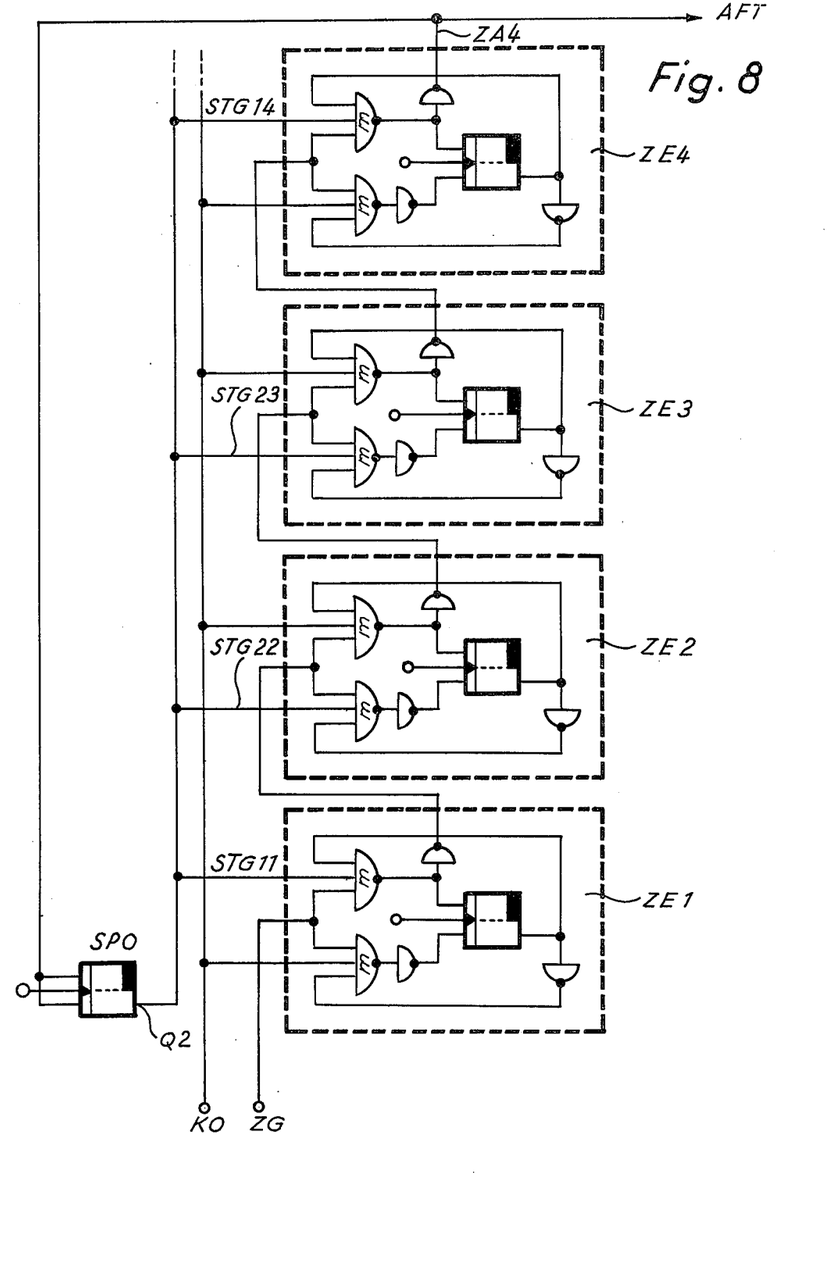
FIG. 8 is a schematic circuit diagram of a synchronous modulo-10 counter constructed in accordance with the invention.

The switching arrangement according to FIG. 8 illustrates a synchronous modulo-10 counter which is also constructed with counter elements according to FIG. 6. Consequently, similar component groups and parts are provided with the same references as were already utilized in the circuit arrangement according to FIG. 7.

A substantial difference in view of the latter circuit arrangement resides in the fact that the counter information output ZA4 of the last counter element ZE4 is connected with the set and reset inputs of a storage circuit corresponding to the storage circuit of FIG. 1, which comprises a master-slave flip-flop having a majority decision circuit. Since the counter according to FIG. 8 carries out a frequency division at a ratio of 1:10 based on a presetting, the individual counter elements ZE1--ZE4 must be preset after a counter information occurs which serves as a transmission signal, via the output ZA4. This is done by means of the storage circuit SPO according to a time-wise standardization via one each of the two control inputs of the individual counter elements. The presetting has to be made in such a way that the counter is preset at the beginning of the counting in the position "6." This means that the counter elements ZE1 and ZE4 are positioned in the illustrated basic position, whereas the intermediate two counter elements ZE2 and ZE3 are set instead of being reset in the basic position. For this purpose, the output Q2 of the storage circuit SPO is connected to the first and last counter elements ZE1 and ZE4, respectively, with the respective first control line STG11 and STG4. Of the two intermediate counter elements ZE2 and ZE3, in each case the second control lines STG22 and STG23 are connected with the output Q2 of the storage circuit SPO. The presetting of the counter according to FIG. 8, in various initial positions, corresponds approximately to the adjustment via the basic position input GG of the counter according to FIG. 7; however, with the difference that not all counter elements are preset to the basic position which is illustrated by the symbol.

By the selection of another presetting within the measuring volume which is prescribed by the number of counter elements used for the counter, a different division ratio can be obtained. This is only a question of the wiring of the individual control inputs of the counter elements ZE1--ZE4 with the storage circuit SPO. All first or second control inputs of the counter elements ZE1--ZE4 which are not connected with the control circuit SPO are connected in common and receive the logic value 0 by way of the terminal KO. The input for the counter pulses is designated in the present counter with the reference ZG. After the counting of a number of input signals corresponding to the dividing ratio (here, 1:10) an output signal is released via the output AFT. A detailed description of the shifting process after the presetting of the counter under the effect of the counter pulses will not be described herein, since the mode of operation of frequency dividers is well known to those versed in this art.

Although I have described my invention by reference to particular illustrative embodiments thereof, many changes and modifications of the invention may become apparent to those skilled in the art without departing from the spirit and scope of the invention. I therefore intend to include within the patent warranted hereon all such changes and modifications as may reasonably and properly be included within the scope of my contribution to the art.

I claim:

1. A counter element for modulo-n and modulo-$2^m$ counters, comprising:
   a storage member including a master-slave flip-flop having a set input, a reset input and an output Q, an inverter connected to said reset input, and a first circuit for performing a majority decision of two variables in conjunction with the output of the slave having an output for inverted signals which is connected to said set input and to said inverter and three inputs, one of said three inputs connected to said output Q and the other two inputs S and R for receiving respective digital variable signals such that the storage member operates in accordance with the truth table

| S | R | Qto | Qtl |
|---|---|-----|-----|
| L | O | O | O |
| L | L | O | L |
| O | L | L | L |
| O | O | L | O |
| L | O | L | L |
| L | L | L | L |
| O | L | O | O |
| O | O | O | O | which satisfies the Boolean equation $$Qtl = S \cdot R + Qto \cdot (S + R)$$

in which Qto is the state at the output Q prior to information transfer from master to slave;
   a second majority decision circuit having three inputs, and an output for inverted signals connected to one of said other inputs of said first majority decision circuit;
   a first inverter and a second inverter;
   a third majority decision circuit having three inputs, and an output for inverted signals connected to the remaining input of said first majority decision circuit via said first inverter,
   a first of said inputs of said second majority decision circuit and a first of said inputs of said third majority decision circuit connected together to serve as an information input,
   a second of said inputs of said second majority decision circuit connected to said output of said master-slave flip-flop, and a second of said inputs of said third majority decision circuit connected to said output of said master flip-flop via said second inverter;
   the third inputs of said second and third majority decision circuits adapted to receive logic control signals which cause those circuits to respond to their input signals in accordance with predetermined logic functions; and
   a third inverter connected to the output of said second majority decision circuit to serve as an information output for said counter element.

2. A synchronous modulo-$2^m$ counter with reversible counting, according to claim 1, comprising
   a plurality m of said counter elements connected in a serial chain with said third inverter of each said counter element, except the last element, of the chain connected to said information input of the next counter element of the chain,
   said third inputs of said second majority decision circuits of each of said elements connected together to form a basic position input for said counter,
   an EXCLUSIVE OR circuit having an output connected to said information input of the first counter element of the chain, a first input connected to said third inputs of said second majority decision circuits, and a second input for receiving pulses to be counted,
   said third inputs of said third majority decision circuits connected together to form a switching input,
   an OR gate having an output connected to said basic position input, a first input adapted to receive a basic position control signal, and a second input connected to said switching input to receive a control signal for causing the counter to reverse its counting direction.

3. A synchronous modulo-n counter, according to claim 1, comprising:
   a plurality of said counter elements connected in a serial chain with said third inverter of each said counter element, except the last element, of the chain connected to said information input of the next counter element of the chain,
   said information input of the first stage of the chain adapted to receive pulses to be counted,
   a second storage circuit constructed as the first-mentioned storage circuit and having its inputs connected to said third inverter of the last counter element of the chain and its output connected to selected ones of said third inputs of said second and third majority decision circuits to define a presetting state for said counter, and
   said third inputs of said second and third majority decision circuits which are not connected to said output of said second storage circuit connected together and adapted to receive a logic control signal.

4. A counter element for modulo-n and modulo-$2^m$ counters, comprising:
   information storage means having first and second inputs and an output and responsive to input signals to satisfy the Boolean equation $Qtl = S \cdot R + Qto \cdot (S + R)$ and fulfill the truth table

| S | R | Qto | Qtl |
|---|---|-----|-----|
| L | O | O | O |
| L | L | O | L |
| O | L | L | L |
| O | O | L | O |
| L | O | L | L |
| L | L | L | L |
| O | L | O | O |
| O | O | O | O | where Qto is prior stored information and S and R are present signals at said inputs;

inverter means;

first majority decision means having three inputs, and an output connected to said first input of said information storage means, and operating to provide an output signal which is inverted with respect to the majority of signals applied to its three inputs;

second majority decision means having three inputs, and an output connected to said second input of said information storage means, and operating without output signal inversion, first ones of said inputs of said first and second majority decision means connected together to form an information input for said counter element, second ones of said inputs of said first and second majority decision means each connected to said output of said information storage means with said inverter means interposed between said output and said second input of said second majority decision means, third ones of said inputs of said first and second majority decision means adapted to receive control signals which condition the majority decision circuits to operate in accordance with predetermined logic functions; and signal output means connected to said first input of said information storage means to take output signals from said counter element.

* * * * *